United States Patent
Denbaars et al.

(10) Patent No.: US 7,813,400 B2
(45) Date of Patent: Oct. 12, 2010

(54) GROUP-III NITRIDE BASED LASER DIODE AND METHOD FOR FABRICATING SAME

(75) Inventors: Steven Denbaars, Goleta, CA (US); Shuji Nakamura, Santa Barbara, CA (US); Monica Hansen, Santa Barbara, CA (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 11/600,617

(22) Filed: Nov. 15, 2006

(65) Prior Publication Data

US 2008/0112453 A1     May 15, 2008

(51) Int. Cl.
*H01S 5/00*     (2006.01)
(52) U.S. Cl. .............. 372/45.011; 372/45.012; 372/43.01
(58) Field of Classification Search ............ 372/45.011, 372/45.012, 43.01
See application file for complete search history.

(56) References Cited

U.S. PATENT DOCUMENTS

| | | | |
|---|---|---|---|
| 4,152,044 A | 5/1979 | Liu | |
| 4,675,575 A | 6/1987 | Smith | |
| 5,477,436 A | 12/1995 | Bertling et al. | |
| 5,592,501 A | 1/1997 | Edmond et al. | 372/45 |
| 5,838,706 A | 11/1998 | Edmond et al. | 372/45 |
| 6,046,464 A | 4/2000 | Schetzina | |
| 6,330,111 B1 | 12/2001 | Myers | |
| 6,331,915 B1 | 12/2001 | Myers | |
| 6,657,393 B2 | 12/2003 | Natsume | |
| 6,746,889 B1 | 6/2004 | Eliashevich et al. | |
| 6,784,463 B2 | 8/2004 | Camras et al. | |
| 6,932,497 B1 | 8/2005 | Huang | |
| 7,087,936 B2 | 8/2006 | Negley | |
| 2002/0015013 A1 | 2/2002 | Ragle | |
| 2002/0054495 A1 | 5/2002 | Natsume | |
| 2003/0015708 A1 | 1/2003 | Parikh et al. | |
| 2003/0020069 A1* | 1/2003 | Holmes et al. | 257/76 |
| 2003/0165169 A1* | 9/2003 | Nomoto et al. | 372/46 |
| 2004/0207313 A1 | 10/2004 | Omoto et al. | |
| 2005/0173692 A1 | 8/2005 | Park et al. | |

(Continued)

FOREIGN PATENT DOCUMENTS

EP     0936682     8/1999

(Continued)

OTHER PUBLICATIONS

The Second Office Action from People's Republic of China, re: China Application No. 200480027969.2, date: Jul. 4, 2008.

(Continued)

*Primary Examiner*—Minsun Harvey
*Assistant Examiner*—Kinam Park
(74) *Attorney, Agent, or Firm*—Koppel, Patrick, Heybl & Dawson

(57) ABSTRACT

A laser diode comprising a first separate confinement heterostructure and an active region on the first separate confinement heterostructure. A second separate confinement heterostructure is on the active region and one or more epitaxial layers is on the second separate confinement heterostructure. A ridge is formed in the epitaxial layers with a first mesa around the ridge. The first mesa is 0.1 to 0.2 microns above the second confinement heterostructure.

20 Claims, 2 Drawing Sheets

U.S. PATENT DOCUMENTS

| | | | |
|---|---|---|---|
| 2006/0034576 A1* | 2/2006 | Merritt et al. | 385/129 |
| 2006/0081862 A1 | 4/2006 | Chua et al. | |
| 2006/0158899 A1 | 7/2006 | Ayabe et al. | |
| 2007/0025231 A1* | 2/2007 | Ochiai et al. | 369/122 |
| 2007/0090383 A1 | 4/2007 | Ota et al. | |
| 2008/0036364 A1 | 2/2008 | Li et al. | |

FOREIGN PATENT DOCUMENTS

| | | |
|---|---|---|
| EP | 0936682 A | 8/1999 |
| EP | 1349202 A | 10/2003 |
| EP | 1653255 | 5/2006 |
| EP | 1681509 | 7/2006 |
| FR | 2586844 | 3/1987 |
| FR | 2759188 | 8/1998 |
| FR | 2814220 | 3/2002 |
| WO | 9856043 | 12/1998 |
| WO | WO 9856043 | 12/1998 |
| WO | WO 0211212 A | 2/2002 |
| WO | 03044870 | 5/2003 |
| WO | WO 03/080763 | 10/2003 |
| WO | WO 2007005844 A | 1/2007 |

OTHER PUBLICATIONS

International Search Report for PCT/US2008/004453, Date: Sep. 9, 2008.
Written Opinion for PCT/US2008/004453, Date: Sep. 9, 2008.
Publication No. 2005/152127, Publication Date: Jul. 14, 2005.
Publication No. 2005/077535, Publication Date: Apr. 14, 2005.
Publication No. 2006/220046, Publication Date: Oct. 5, 2006.
Publication No. 2008/074032 Publication Date: Mar. 27, 2008.
Kim J K et al. "Strongly Enhanced Phosphor Efficiency in GaInN White Light-Emitting Diodes Using Remote Phosphor Configuration and Diffuse Reflector Cup", Japanese Journal of Applied Physics, Japan Society of Applied Physics, Tokyo, JP, vol. 44, No. 20-23, Jan. 1, 2005, XP-001236966.
Notice Requesting Submission of Opinion re related Korean Application No. 10-2004-7001033, dated: Mar. 9, 2009.
Sakai et al., "Experimental Investigation of Dependence of Electrical Characteristics on Device Parameters in Trench Mos Barrier Shottky Diodes", Proceedings of 1998 International Symposium on Power Semiconductor Devices & ICs, Kyoto, pp. 293-296, Jun. 1998.
Zhang AP et al, "Comparison of Gan P-I-N and Schottky Rectifier Performance" IEEE Transactions on Electron Devices, IEEE Inc. New York, US, vol. 48, No. 3, pp. 407-411, Mar. 2001.
European Search Report, Feb. 24, 2009, re related European Application No. EP 08253301.
Zhang et al. "Comparison of GaN P-I-N and Schottky Rectifier Performance", IEEE Transactions on Electron Devices, vol. 48, No. 3, Mar. 2001, pp. 407-411.
Sakai et al., "Experimental Investigation of Dependence of Electrical Characteristics on Device Parameters in Trench MOS Barrier Schottky Diodes", 1998, International Symposium on Power Semiconductor Devices & ICs, Kyoto, pp. 293-296.
European Search Report re related European Application No. 08253301.9-2222, Feb. 24, 2009.
European Search Report re related EP Appl. 08160129.6.2222, Dated: Dec. 15, 2008.
Asbeck et al."Enhancement of Base Conductivity Via the Piezoelectric Effect in AlGaN/GaN HBTs", Solid State Electronics, Elsevier Science Pub. Barking GB, vol. 44, No. 2, Feb. 1, 2000 pp. 211-219, XP004186190.
Simon et al. "Polarization-Induced 3-Dimensional Electron Slabs in Graded A1GaN Layers", Materials Research Society Symposium Proceedings 2006 Materials Research Society US, vol. 892, Nov. 28, 2005, pp. 417-722.
Offical Notice of Final Decision of Rejection re related Japanesse Patent Appl. No. 2003-529535, Dated: Jan. 6, 2009.
European Communication from related European Appl. 02 798 906. 0-1235, Dated Feb. 6, 2009.
Copending U.S. Appl. No. 11/443,741, date: Jun. 14, 2007.
Copending U.S. Appl. No. 11/685,761, date: Mar. 13, 2007.
Copending U.S. Appl. No. 11/939,059, date: Nov. 13, 2007.
PCT Search Report and Written Opinion PCT/US2007/086237, date: May 8, 2008 in related application.
PCT Search Report and Written Opinion PCT/US2007/12403, Date: Aug. 6, 2008.
PCT Search Report and Written Opinion PCT/US2007/086242, Date: Mar. 4, 2008.
U.S. Appl. No. 11/613,692, filed Dec. 20, 2006.
U.S. Appl. No. 11/614,180, filed Dec. 21, 2006.
U.S. Appl. No. 11/624,811, filed Jan. 19, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/755,153, filed May 30, 2007.
U.S. Appl. No. 11/856,421, filed Sep. 17, 2007.
U.S. Appl. No. 11/859,048, filed Sep. 21, 2007.
U.S. Appl. No. 11/939,047, filed Nov. 13, 2007.
U.S. Appl. No. 11/936,163, filed Nov. 7, 2007.
U.S. Appl. No. 11/843,243, filed Aug. 22, 2007.
U.S. Appl. No. 11/939,052, filed Nov. 13, 2007.
U.S. Appl. No. 11/736,799, filed Apr. 18, 2007.
U.S. Appl. No. 11/877,038, filed Oct. 23, 2007.
U.S. Appl. No. 11/870,679, filed Oct. 11, 2007.
U.S. Appl. No. 11/948,041, filed Nov. 30, 2007.
U.S. Appl. No. 11/949,222, filed Dec. 3, 2007.
U.S. Appl. No. 12/174,053, filed Jul. 16, 2008.
U.S. Appl. No. 12/002,429, filed Dec. 4, 2007.
U.S. Appl. No. 12/045,729, filed Mar. 11, 2008.
U.S. Appl. No. 11/818,818, filed Jun. 14, 2007.
Notice of First Office Action from related China Patent Application No. 200710142217.6, dated: Jun. 22, 2009.
Office Action from related U.S. Appl. No. 11/600,618, dated: Feb. 4, 2010.
European Search Report from related European Application No. 07254498.4, received on Feb. 11, 2010.
(From related application) Canadian Patent Application No. 2,454,310, Office Action dated Feb. 9, 2010.
Official Communication from the EPO regarding related European Application 08253301.9, dated: Nov. 17, 2009.
Second Office Action from related Chinese Application No. 200710142217.6, dated: Nov. 6, 2009.

\* cited by examiner

FIG. 1
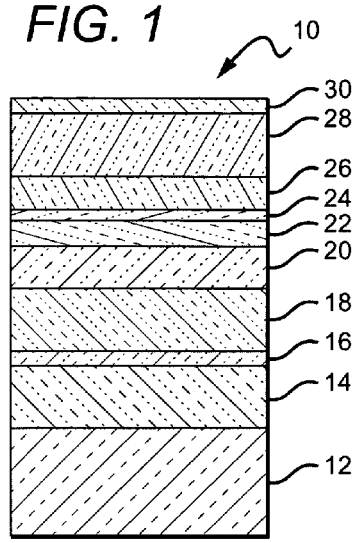
FIG. 3
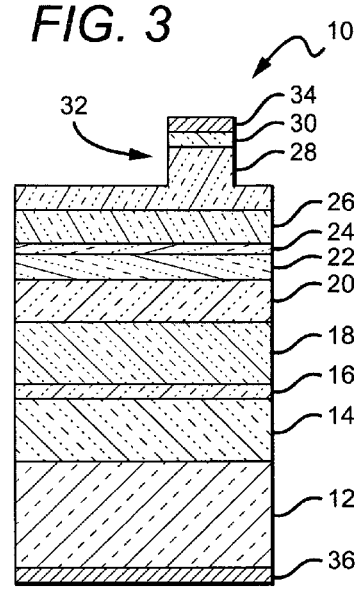
FIG. 2
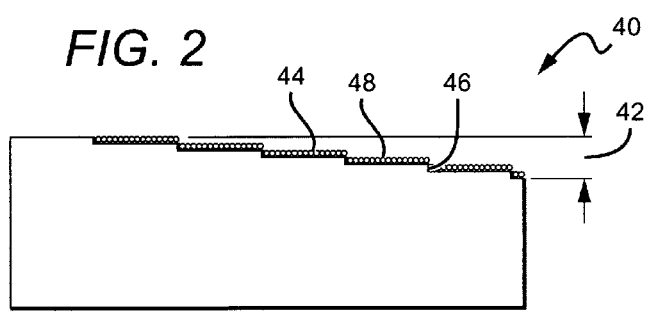
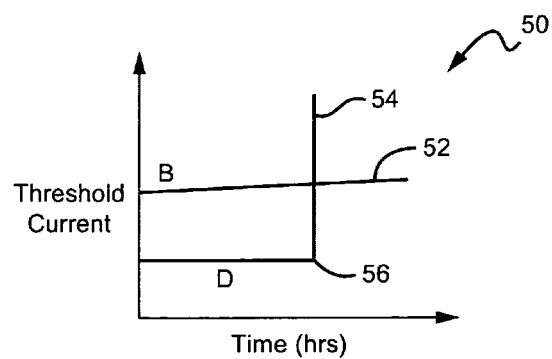
FIG. 4

GROUP-III NITRIDE BASED LASER DIODE AND METHOD FOR FABRICATING SAME

BACKGROUND OF THE INVENTION

1. Field of the Invention

This invention relates to laser diodes, and more particularly to nitride based semiconductor laser diodes and methods for fabricating same.

2. Description of the Related Art

A laser is a device that produces a beam of coherent light as a result of stimulated emission. Light beams produced by lasers can have high energy because of their single wavelength, frequency, and coherence. A number of materials are capable of producing a lasing effect and include certain high-purity crystals (such as ruby), semiconductors, certain types of glass, certain gasses including carbon dioxide, helium, argon and neon, and certain plasmas.

More recently there has been increased interest in lasers made of semiconductor materials. These devices typically have a smaller size, lower cost, and have other related advantages typically associated with semiconductor devices. Semiconductor lasers are similar to other lasers in that the emitted radiation has spacial and temporal coherence, and like other lasers, semiconductor lasers produce a beam of light that is highly monochromatic (i.e., of narrow bandwidth) and is highly directional. Overall, semiconductor lasers provide very efficient systems that are easily modulated by modulating the current directed across the devices. Additionally, because semiconductor lasers have very short photon lifetimes, they can be used to produce high-frequency modulation.

One type of semiconductor laser diode is referred to as an edge emitting laser where the stimulated emission is from the side surface or edge of the laser diode. These devices typically have epitaxial layers in the form of waveguiding or reflective elements (cladding layers) with a light generating active region between the reflective elements. Additional layers can be included between the reflective elements to form a laser cavity. The edges of the laser diode can be cleaved during manufacturing to form edge reflective surfaces or facets. A total reflectivity (TR) material can cover one edge, and an anti reflectivity (AR) material can cover the opposite edge. Light from the active region is reflected between the edges and within the cavity by the reflective elements, with stimulated emission emitting from the edge with the AR material. After application of the TR and AR materials, the individual laser diodes can be separated.

A known characteristic of laser diodes (and light emitting diodes) is that the frequency of radiation that can be produced by the particular laser diode is related to the bandgap of the particular semiconductor material. Smaller bandgaps produce lower energy, shorter wavelength photons, while wider bandgaps produce higher energy, shorter wavelength photons. One semiconductor material commonly used for lasers is indium gallium aluminum phosphide (InGaAlP), which has a bandgap that is generally dependant upon the mole of atomic fraction of each element present. This material, regardless of the different element atomic fraction, produces only light in the red portion of the visible spectrum, i.e., about 600 to 700 nanometers (nm).

Laser diodes that produce shorter wavelengths not only produce different colors of radiation, but offer other advantages. For example, laser diodes, and in particular edge emitting laser diodes, can be used with optical storage and memory devices (e.g. compact disks (CD) digital video disks (DVD), high definition (HD) DVDs, and Blue Ray DVDs). Their shorter wavelength enables the storage and memory devices to hold proportionally more information. For example, an optical storage device storing information using blue light can hold approximately 32 times the amount of information as one using red light, using the same storage space. There are also applications for shorter wavelength laser in medical systems and projection displays. This has generated interest in Group-III nitride material for use in laser diodes, and in particular gallium nitride (GaN). GaN can produce light in the blue and ultra violet (UV) frequency spectrums because of its relatively high bandgap (3.36 eV at room temperature). This interest has resulted in developments related to the structure and fabrication of Group-III nitride based laser diodes [For example see U.S. Pat. Nos. 5,592,501 and 5,838,706 to Edmond et al]

Group-III nitride laser diodes can require relatively high threshold currents and voltages to reach laser radiation because of optical and electrical inefficiencies. These elevated current and voltage levels can result in heat being generated during laser diode operation. In certain applications, laser diodes are driven by a pulsed signal that results in pulsed laser light being emitted from the laser diode. The heat generated within the laser diode typically does not present a problem during pulsed laser diode operation because the laser diode has the opportunity to cool during the lows of the signal. For other important applications, however, it can be desirable to drive the laser diode with a continuous wave (CW). CW operation is particularly applicable to operation with optical storage devices that can require a continuous light source for data storage and retrieval. Driving many current Group-III based laser diodes with a CW having the threshold current and voltage necessary for laser emission can result in heating that can damage or destroy the laser diode. Heat sinks or other cooling methods/devices can be employed to reduce operating heat within these laser diodes, but the methods/devices can increase the cost and complexity of the devices and can require additional space.

SUMMARY OF THE INVENTION

The present invention is generally directed to laser diode epitaxial structure having improved operating characteristics and improved reliability, and methods for fabricating the epitaxial structures. The improved operating characteristics include operation as reduced current and voltage thresholds, which allow for efficient operation at reduced temperature.

One embodiment of a laser diode according to the present invention comprises a first separate confinement heterostructure and an active region on the first separate confinement heterostructure. A second separate confinement heterostructure is on the active region and one or more epitaxial layers is on the second separate confinement heterostructure. A ridge is formed in the epitaxial layers with a first mesa around the ridge. The first mesa is 0.1 to 0.2 microns above the second confinement heterostructure.

One method for fabricating a laser diode according to the present invention comprises providing a growth wafer and growing a first guiding layer on the growth wafer. An active region is grown on the first guiding layer and a second guiding layer is grown on the active region. One or more epitaxial layers are grown on the second guiding layer. A ridge is etched and a first mesa is formed on the epitaxial layers, the first mesa being 0.1 to 0.2 microns above the second guiding layer.

These and other further features and advantages of the invention will be apparent to those skilled in the art from the following detailed description, taken together with the accompanying drawings.

BRIEF DESCRIPTION OF THE DRAWINGS

FIG. 1 is sectional view of one embodiment of a laser diode according to the present invention;

FIG. 2 is a sectional view of an off-angle substrate according to the present invention.

FIG. 3 is a sectional view of another embodiment of a laser diode according to the present invention;

FIG. 4 is a graph showing laser diode threshold current operation;

DETAILED DESCRIPTION OF THE INVENTION

Figure 5:
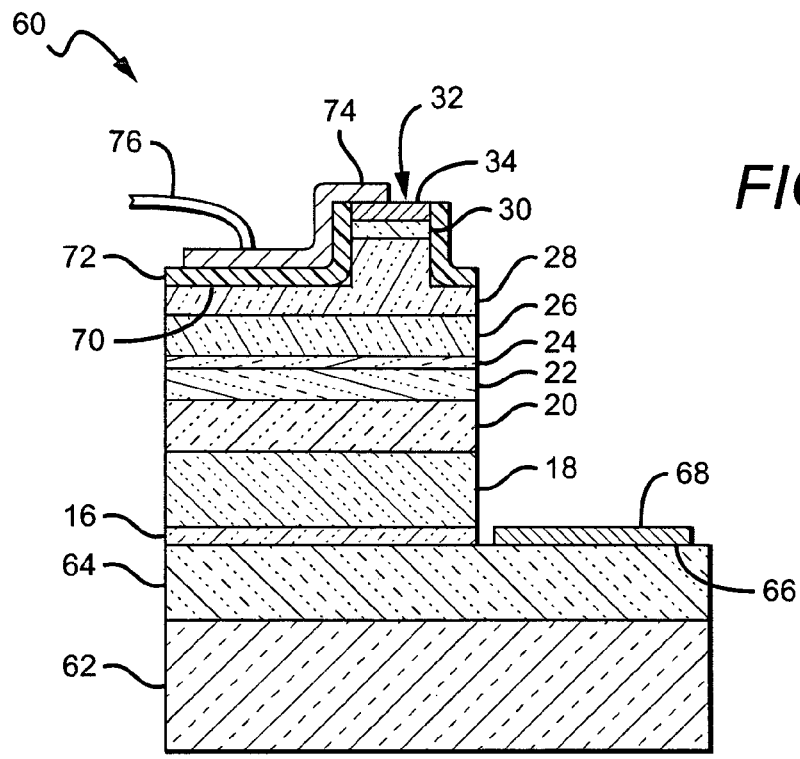
FIG. 5 is a sectional view of still another embodiment of a laser diode according to the present invention.

The present invention provides high reliability, high output power nitride-based laser diode characterized by reduced threshold current densities and reduced threshold voltages. The present invention is particularly adapted for laser diodes having a ridge for optical and electrical confinement, with the ridge being etched to level in the laser diode structure that allows for reduced threshold current operation while at the same time allowing for reliable lifetime operation. The present invention is also directed to additional laser diode structural and manufacturing improvements that further enhance laser diode operation.

The present invention is described herein with reference to certain embodiments but it is understood that the invention can be embodied in many different forms and should not be construed as limited to the embodiments set forth herein. It is also understood that when an element or component is referred to as being "on", "connected to" or "coupled to" another layer, element or component, it can be directly on, connected to or coupled to the other layer element or component, or intervening elements may also be present. Furthermore, relative terms such as "inner", "outer", "upper", "above", "lower", "beneath", and "below", and similar terms, may be used herein to describe a relationship of one component or element to another. It is understood that these terms are intended to encompass different orientations of the device in addition to the orientation depicted in the figures.

Although the terms first, second, etc. may be used herein to describe various layers, elements, components and/or sections, these layers, elements, components, and/or sections should not be limited by these terms. These terms are only used to distinguish one layer, element, component, or section from another. Thus, a first layer, element, component, or section discussed below could be termed a second element, component, or section without departing from the teachings of the present invention.

Embodiments of the invention are described herein with reference to cross-sectional view illustrations that are schematic illustrations of idealized embodiments of the invention. It is understood that many of the layers will have different relative thicknesses compared to those shown and that the laser diodes will have different shapes. Further, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Embodiments of the present invention may be particularly well suited for use in nitride-based devices such as Group III-nitride based laser diodes. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. As well understood by those in this art, the Group III elements can combine with nitrogen to form binary (e.g., GaN), ternary (e.g., AlGaN and AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$, where 0×1, are often used to describe them.

FIG. 1, shows one embodiment of a laser diode 10 according to the present invention at an intermediate fabrication stage. Although a single laser diode 10 is shown, it is understood that many laser diodes are typically fabricated on a single substrate wafer, with the devices then being separated into individual devices using known processes, such as facet cleaving to form die arrays and die separation using scribe and break processes. The layers of laser diodes according to the present invention can be formed or grown on a substrate wafer using known fabrication processes such as growth in a reactor by metalorganic chemical vapor deposition (MOCVD).

The present invention can be utilized with many different laser diode structures arranged in different ways, with the laser diode 10 being only one example of such a laser diode structure. The laser diode 10 comprises a substrate 12 that can be made of many different materials such as sapphire, silicon carbide, or GaN. The preferred laser diode 10 is formed on a free-standing GaN substrate lateral epitaxial overgrown (LEO) pendeo GaN, or a substrate with a lateral epitaxial overgrowth layer on the a substrate such as silicon or silicon carbide. Alternatively, the substrate can be GaN grown by hybrid vapor-phase epitaxy (HVPE)

Lower threading dislocation densities in GaN based epitaxial structures can enhance the operating characteristics and if the initial epitaxial layers are grown with low threading dislocation densities it will spread to the layers that follow. It is preferable that the threading dislocation densities be less than approximately $5 \times 10^5$ $cm^{-2}$ in the laser diode's GaN based epitaxial layers, which can reduce threshold current. This can also reduce dopant (Mg) diffusion to the active region, which can improve reliability. Different fabrication processes can be used according to the present invention to achieve low dislocation densities such as pendeo or lateral epitaxy overgrowth of GaN. This can be done as one of the first layers in the laser diode. In one embodiment, a GaN layer is formed on a substrate, such as sapphire. Pillars with top surface mesas are etched in the GaN layer and partially into the sapphire substrate. GaN is grown over the pillars and substrate, and GaN grows on the mesas of the pillars as well as laterally outward. The GaN grown on the mesas has substantially the same dislocation density as the pillar below, but the threading dislocation from the pillar does not propagate to the laterally grown GaN. The laterally grown GaN grows together between adjacent pillars to form a reduced dislocation density surface. This reduced dislocation will spread to subsequent growth layers.

Off-angle substrates for GaN growth can improve the surface morphology and can provide for smooth growth surfaces for laser diode epitaxial layers. This in turn provides a more efficient active region that operates at reduced threshold current and provides improved reliability. FIG. 2 illustrates one embodiment of an off-angle cut substrate 40 according to the present invention and it is understood that for ease of understanding, the substrate 40 and its features are not to scale. When the substrate 40 is cut with off-angle 42, the crystalline nature of the substrate results in the formation of steps 44 along the cut surface with step edges 46 between the steps 44. If the off-angle 44 of the cut can be controlled, a consistent and repeatable step surface can be formed. Atoms from the growth gas attach to the growing surface in a low energy configuration, and for substrate 40 when the growth atoms 48 encounter the surface of the step edge 46 they attach at the step edge 46 as a low energy configuration. The film or epitaxial layer grow smoothly in a step flow mode growth by the atoms 48 first attaching to the step edges 46 and then terrace growing across the surface of each step 44. This in turn provides for a smoother interface for the layers grown on the substrate 40, including the quantum well growth. The off-angle 44 of the substrate 40 can be at different angles with a suitable range of angles being between 0.1 to 5°, and a preferred off-angle being 0.5 to 1°.

An n-type contact layer 14 is grown on the substrate 12 and comprises a semiconductor material suitable for spreading current from an n-contact to the active region. Many different materials can be used for the n-type contact layer, with a preferred material being n-type doped GaN, with a suitable dopant being silicon (Si). As further described below, for laser diodes that are formed on conductive substrates, the n-contact can be formed on the substrate 12 and currents from an electrical signal applied to the n-contact conducts through the substrate 12 and n-contact layer 14, to the active region of the laser diode 10. For laser diodes formed on non-conductive substrates or substrates that do not efficiently spread current, a lateral geometry can be used for contacting the device. In these embodiments the laser diode 10 can be etched to form a mesa in the n-type contact layer 14 and the n-contact is deposited on the contact layer mesa. Current spreads from the contact, through the n-type contact layer 14 and to the laser diode's active region.

It is also understood that laser diodes formed on a conductive substrate can effectively spread current without the n-type contact layer 14, and that these embodiments can be arranged without the n-type contact layer 14. It is further understood that other embodiments of the present invention can have the substrate removed, and contact can be made directly to the epitaxial layers.

A compliance layer 16 can be included on the n-type layer to help reduce the strain between the n-contact layer 14 and subsequent epitaxial layers of the laser diode 10. The compliance layer can be made of many different materials, with a preferred compliance layer being made of an n-type InGaN with Si doping. A waveguiding element 18 is included on the compliance layer 16 with a preferred waveguiding element being a strained layer superlattice (SLS) structure comprising layers of semiconductor material. Many different materials can be used for the n-type SLS layers with preferred materials being AlGaN/GaN with Si-doping of the GaN layer(s) only.

An n-type guiding layer 20 is formed on the n-type SLS 18 with the guiding layer also referred to as a separate confinement heterostructure (SCH). The n-type SCH 20 serves as part of the light path to the edges of the laser diode 10 and ultimately out the emission edge of the laser diode 10. The light from the active region traveling toward the waveguiding elements (n-type SLS 20 and the p-type SLS described below) is reflected, and light traveling toward the laser diode's edges is reflected until stimulated emission is out one of the edges. The n-type SCH layer 20 and p-type SCH layer serve as the primary reflection cavity for this reflected light. The n-type SCH 20 can comprise many different materials with a preferred material being n-type doped GaN grown with Si doping.

The active region 22 is grown on the n-type SCH layer 20 and the active region can comprise different layers arranged in different ways, with a preferred active region comprising a MQW region that can have different numbers of quantum wells and barrier layers. In one embodiment according to the present invention, MQW active region 22 comprises three quantum wells and associated barrier layers made of InGaN.

The laser diode 10 further comprises an electron blocking layer 24 formed on the MQW active region 22. The blocking layer 24 comprises a material that blocks electrons from passing from the MOW active region 22 into the p-type SCH layer (described below), but lets holes pass through to form the p-type SCH layer to the MQW active region 22. By blocking electrons, the blocking layer encourages recombination in the MQW active region 22. The blocking layer can be made of many different materials, with a suitable material being p-type AlGaN with Mg doping. A p-type guiding layer or SCH 26 is formed on the electron blocking layer 24. The p-type SCH can be made of many different materials with a suitable material being p-type GaN with Mg doping.

A second waveguiding element 28 is included on the p-type SCH layer 26, with the waveguiding element 28 preferably comprising a p-type SLS made of AlGaN/GaN layers with Mg doping the GaN layer only. Finally, a p-type contact layer 30 is included on the p-type SLS. The contact layer can also comprise many different materials, with a preferred material being p-type GaN with Mg-doping.

The laser diode 10 as shown in FIG. 1 can then have a p-contact and n-contact deposited on it using known techniques such as photolithography and liftoff techniques. The p-contact is typically deposited on the p-type contact layer 30 and the n-contact can be on either the substrate (for conductive substrates) or on the n-contact mesa as further described below. More commonly, however, a ridge etched from the laser diodes top surface. The ridge provides electrical and optical confinement and index-guiding for the particular wavelength of light generated by the laser diode's active region. This in turn can allow for operation at lower threshold currents and voltages. The ridge can be formed using known mask and etching processes with a suitable etching process being plasma reactive ion etching (RIE). The p- and n-contacts can be made of many different materials such as gold (Au), nickel (Ni), platinum (Pt), Al, or combinations thereof.

FIG. 3 shows the laser diode 10 at a subsequent fabrication step having a ridge 32 etched from its top surface with the ridge arranged to provide optical and electrical confinement, which can result in lower threshold and current operation. The ridge 32 can have many different widths with some ridges being 2 μm or less wide, and preferably in the range of 1.7 to 2 μm. The etching of the ridge 32 can be to different depths in the laser diode 10, with a preferred depth according to the present invention being through the p-contact layer 30 and a portion of the p-type SLS 28. In one embodiment, the ridge 32 is etched through the p-type SLS 28 until the etch reaches 1 to 2 μm (microns) above the p-type SCH 26.

Referring now to the graph 50 in FIG. 4 etching into closer or into the p-type SCH can result in lower threshold current operation, but can also result in shorter lifetimes. The graph 50 shows the threshold current operation for a laser diode over time, with the laser diode having a ridge. The first plot 52 shows a threshold current operation for a laser diode according to the present invention having a ridge etched to 1-2 μm from the p-type SCH. As shown, the threshold current remains relatively constant over time. The second line 54 shows the threshold current operation for a laser diode with the ridge etched into the p-type SCH. The threshold current at the beginning of operation is lower than that of line 52, but the reliability of the laser diode is negatively impacted by this etch depth. A failure point 56 is reached where the threshold current increases dramatically and laser diode fails to operate.

FIG. 3 shows the laser diode 10 at a subsequent fabrication step having a ridge 32 etched from its top surface with the ridge arranged to provide optical and electrical confinement, which can result in lower threshold and current operation. The ridge 32 can have many different widths with some ridges being 2 μm or less wide, and preferably in the range of 1.7 to 2 μm. The etching of the ridge 32 can be to different depths in the laser diode 10, with a preferred depth according to the present invention being through the p-contact layer 30 and a portion of the p-type SLS 28. In one embodiment, the ridge 32 is etched through the p-type SLS 28 until the etch reaches 0.1 to 0.2 μm (microns) above the p-type SCH 26.

Referring now to the graph 50 in FIG. 4 etching into closer or into the p-type SCH can result in lower threshold current operation, but can also result in shorter lifetimes. The graph 50 shows the threshold current operation for a laser diode over time, with the laser diode having a ridge. The first plot 52 shows a threshold current operation for a laser diode according to the present invention having a ridge etched to 0.1 to 0.2 μm from the p-type SCH. As shown, the threshold current remains relatively constant over time. The second line 54 shows the threshold current operation for a laser diode with the ridge etched into the p-type SCH. The threshold current at the beginning of operation is lower than that of line 52, but the reliability of the laser diode is negatively impacted by this etch depth. A failure point 56 is reached where the threshold current increases dramatically and laser diode fails to operate.

Referring back to FIG. 3, the laser diode 10 also comprises a p-contact (ohmic metal) 34 on the top surface of the ridge 32, which is the p-contact layer 30. An n-contact (ohmic metal) 36 can also be included on the substrate 12 for those embodiments having a conductive substrate. The p- and n-contacts 34, 36 can be made of many different materials, with preferred p-contacts being made of platinum (Pt), gold (Au), nickel (Ni), or combinations thereof, and preferred n-contacts being made of titanium (Ti), Al, Au, Ni, or combinations thereof. The p- and n-contacts can also be deposited using know methods.

FIG. 5 shows another embodiment of a laser diode 60 according to the present invention having the same or similar layers as those shown in FIGS. 1 and 3 and described above. For those same and similar layers, the same reference numbers are used with the understanding that the description of those layers above applies to laser diode 60. The laser diode 60 has a non-conductive substrate 62 and for electrical contact to be made to the n-contact layer 64, a contact n-mesa 66 is formed by etching the layers above the n-contact layer 64. An n-contact 68 is deposited on the mesa, and when a bias is applied across the p- and n-contacts 34, 68 current from the n-contact 68 spreads into the n-contact layer 64 and to the active region 22. The ridge 32 for laser diode 60 can have the same etch depth (0.1 to 0.2 μm) to provide low voltage and threshold current operation.

Figure 6:
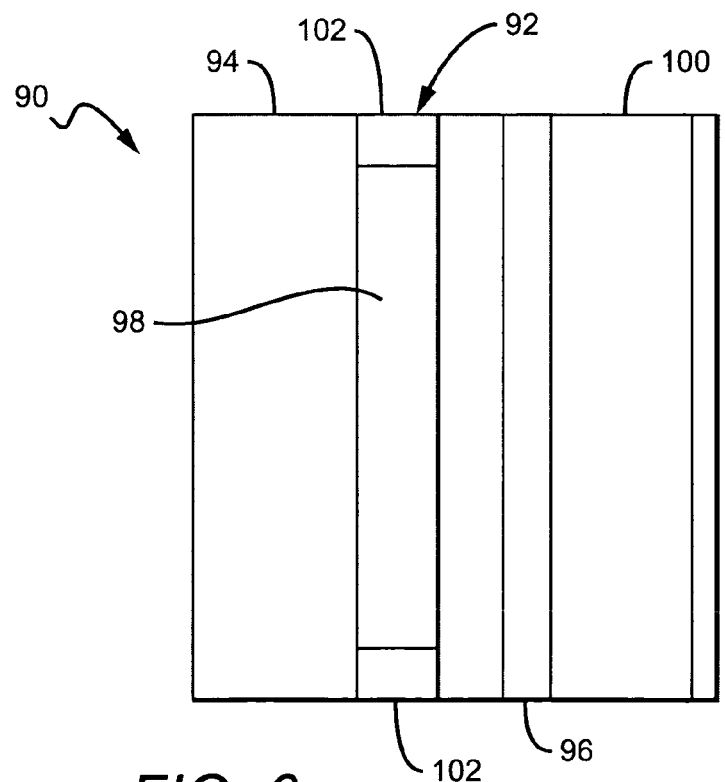
FIG. 6 is a plan view of another embodiment of a laser diode according to the present invention.

FIG. 6 shows a top view of a laser diode 90 (without insulating layer, bond pad or wire bond) according to the present invention, having a ridge 92, p-mesa 94, n-mesa 96, p-contact 98, and n-contact 100, all of which are arranged similar to corresponding features in laser diode 10 and 60 described above and shown in FIGS. 3 and 5. The individual laser diodes undergo a cleaving to form the laser diodes on the wafer into rows of diode arrays, with the cleaving forming the edge facets on opposite sides of the laser diode. The ridge 92, p- and n-mesas 94,96, p-contact 98, and n-contact 100, can all be formed prior to cleaving. According to the present invention, however, the p-contact 98 should not run completely along the ridge 92 when formed on the ridge 92. By instead providing a setback 102 the danger of p-contact 98 peel-off during cleaving and operation is reduced. In one embodiment according to the present invention, the p-contact 98 has a setback 102 that is in the range of approximately 5-10 μm, although other setback lengths can also be used.

In another embodiment the p-contact is a combination of Ni and Au, and because light does not pass through the p-contact, it does not need to be transparent. According to the present invention annealing of the completed laser structure is completed in a nitrogen gas only to provide good ohmic contact. The p-contact does not need to be oxidized during annealing to be made transparent, so oxidizing gas (oxygen) is not needed as part of the annealing gas. Different anneal time frames and temperatures can be used, with the preferred annealing process taking approximately 10 minutes at a temperature range of 600-700° C., with a preferred temperature being approximately 650° C.

To further enhance operation of laser diodes according to the present invention, they should be cleaned with plasma cleaner or asher descum ("plasma cleaner") during fabrication. The plasma cleaner can comprise different compounds, with a preferred compound comprising an $O_2$ plasma cleaning process. The plasma cleaning process can be performed in commercially available systems such as the Technics Model PE-IIA Plasma Etching System or SPI Plasma-Etch II Plasma Etcher, Cleaner and Asher. The asher descum should be used on the facets after cleaving and prior to high reflectivity (HR) and anti-reflectivity (AR) coating of the facets. The plasma cleaning should also be used following photolithography and wet etch steps such as following etching of the ridge or n-type mesa or photolithography for formation of the n-contact or pad metal, all which are described above.

The plasma cleaning should also be used when mounting the laser diode in commercially available packaging or can. The can should be cleaned with a plasma cleaner and the laser diode can then be mounted in the can. The laser diode can be bonded with AuSn solder or similar material. After mounting the can should again be subjected to plasma cleaning, then filled with an inert gas ($N_2$, argon, etc.) and then hermetically sealed. This cleaning process reduces the contaminants that can remain after mounting of the laser diode and sealing of the can.

Although the present invention has been described in considerable detail with reference to certain preferred configurations thereof, other versions are possible. Therefore, the spirit and scope of the appended claims should not be limited to their preferred versions contained therein.

We claim:

1. A laser diode, comprising:
a first separate confinement heterostructure;

an active region on said first separate confinement heterostructure;

a second separate confinement heterostructure on said active region;

one or more epitaxial layers on said second separate confinement heterostructure comprising a first waveguiding element; and a ridge formed in said epitaxial layers and a first mesa around said ridge, said first mesa having a mesa height of 0.1-0.2 μm above said second confinement heterostructure;

a second waveguiding element, said active region and first and second separate confinement heterostructures between said first and second waveguiding elements;

an n-contact layer adjacent said second waveguiding element;

a compliance layer comprising n-type material between said n-contact layer and said second waveguiding element; and an electron blocking layer between said active region and said second separate confinement heterostructure.

2. The laser diode of claim 1, made of semiconductor materials from the Group-III nitride material system.

3. The laser diode of claim 1, wherein said first waveguiding element comprises a first strained layer superlattice.

4. The laser diode of claim 3, further comprising a first contact layer on said first strained layer superlattice.

5. The laser diode of claim 1, wherein said second waveguiding element comprises a second strained layer superlattice.

6. The laser diode of claim 1, wherein said ridge is approximately 1.7 to 2 microns wide.

7. The laser diode of claim 1, wherein said first mesa is greater than or equal to 100 microns wide.

8. The laser diode of claim 1, further comprising first and second contacts, and a bond pad, said first contact on the top of said ridge and said bond pad electrically connected to said first contact.

9. The laser diode of claim 8, wherein said first mesa comprises first and second portions, said first portion being wider than said second portion, at least part of said bond pad on said first portion, further comprising a wire bond connected to said bond pad on said first portion.

10. The laser diode of claim 8, wherein said bond pad comprises a layer of Au having a thickness in the range of 1-2 microns.

11. The laser diode of claim 1, further comprising a substrate said first and second separate confinement heterostructure, active region and one or more epitaxial layers formed on said substrate.

12. The laser diode of claim 11, wherein said substrate is off-angled.

13. The laser diode of claim 12, wherein said substrate is off-angled in the range of 0.1 to 5°.

14. The laser diode of claim 11, wherein said substrate comprises lateral epitaxial overgrowth gallium nitride.

15. The laser diode of claim 11, wherein said substrate comprises GaN grown by hybrid vapor-phase epitaxy (HVPE).

16. The laser diode of claim 8, further comprising opposing facets and said first contact on said ridge and running between said facets, said p-contact having a setback from said facets.

17. The laser diode of claim 16, wherein said setback is in the range of 5 to 10 μm.

18. A laser diode, comprising;

a first guiding layer;

an active region on said first guiding layer;

a second guiding layer on said active region;

one or more epitaxial layers on said second guiding layer; and a ridge formed in said epitaxial layers and a first mesa around said ridge, said first mesa having a mesa height of 0.1-0.2 μm above said second guiding layer;

an n-contact layer adjacent said first guiding layer; and a compliance layer comprising n-type material between said n-contact layer and said first guiding layer.

19. The laser diode of claim 18, wherein said n-type material comprises InGaN.

20. The laser diode of claim 18, wherein said n-type material comprises Si doped InGaN.

* * * * *